(12) United States Patent
Viau et al.

(10) Patent No.: US 8,461,877 B2
(45) Date of Patent: Jun. 11, 2013

(54) CMOS CIRCUIT WITH DYNAMIC PARASITIC NET PULLDOWN CIRCUIT

(75) Inventors: Kyle S. Viau, Fremont, CA (US); James Vinh, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 53 days.

(21) Appl. No.: 13/174,831

(22) Filed: Jul. 1, 2011

(65) Prior Publication Data

US 2013/0002303 A1  Jan. 3, 2013

(51) Int. Cl.
*H03K 19/20* (2006.01)
*H03K 19/094* (2006.01)

(52) U.S. Cl.
USPC ............................. 326/121; 326/98; 326/122

(58) Field of Classification Search
USPC .............. 326/93–98, 104, 112–115, 119–122
See application file for complete search history.

(56) References Cited

U.S. PATENT DOCUMENTS 6,480,875 B1 * 11/2002 Miyoshi et al. ............... 708/702
2010/0194435 A1 * 8/2010 Das .................................. 326/93

* cited by examiner

*Primary Examiner* — Jany Richardson
(74) *Attorney, Agent, or Firm* — Volpe and Koenig, P.C.

(57) ABSTRACT

A complementary metal oxide semiconductor (CMOS) circuit is described. The CMOS circuit includes a plurality of CMOS gates, a plurality of logic inputs and a logic output. Each CMOS gate is connected to a negative power supply terminal (Vss) and a positive power supply terminal (Vdd). The CMOS circuit further includes parasitic nets connected to the CMOS gates, and net pulldown circuits for eliminating a charge accumulation on the parasitic nets while avoiding potential short circuit conditions. The CMOS gates may be OR-AND-INVERT (OAI) gates or AND-OR-INVERT (AOI) gates.

18 Claims, 7 Drawing Sheets

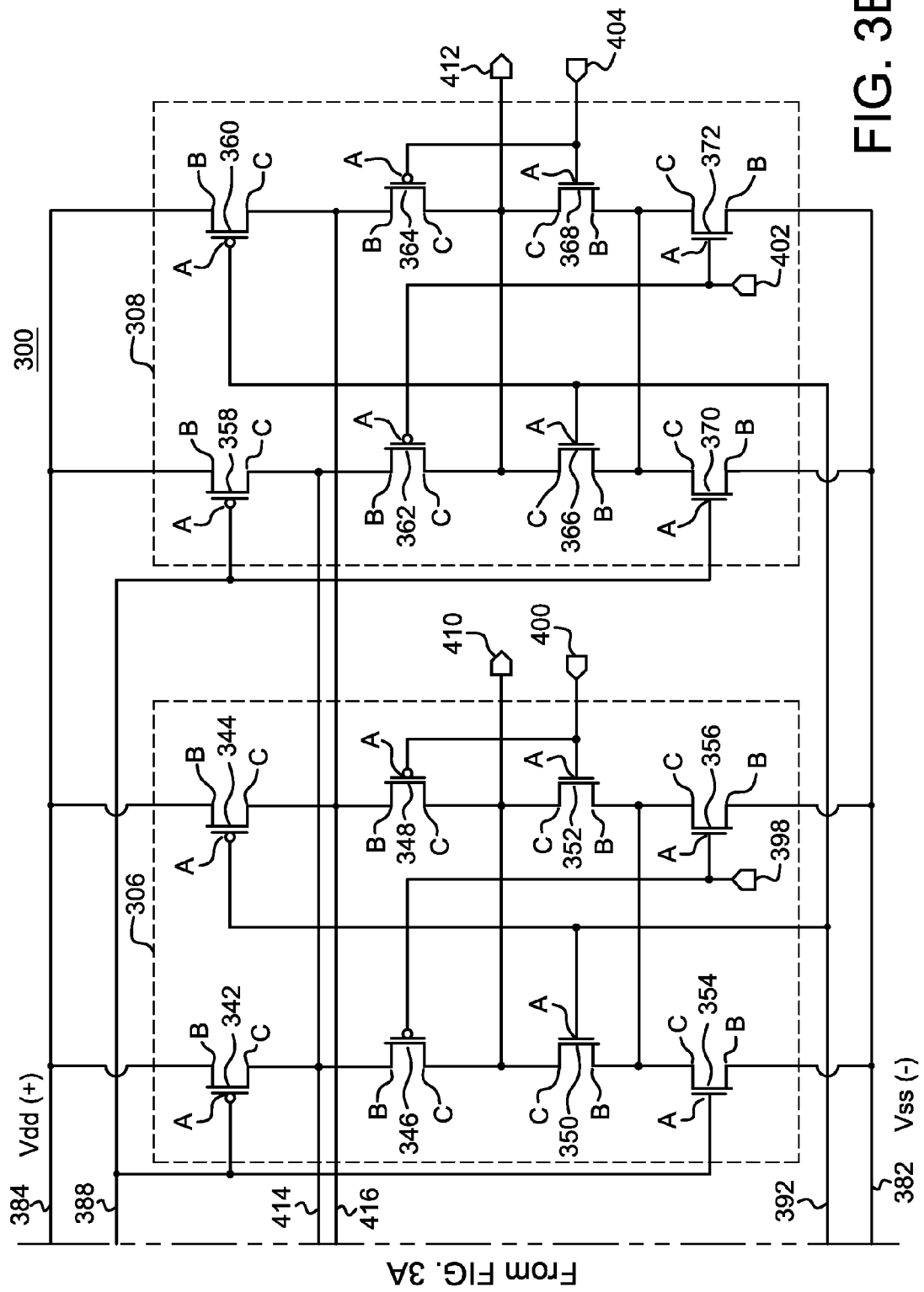

CMOS CIRCUIT WITH DYNAMIC PARASITIC NET PULLDOWN CIRCUIT

FIELD OF INVENTION

This application is related to a transistor circuit. More particularly, this application is related to complementary metal oxide semiconductor (CMOS) technology.

BACKGROUND

CMOS technology is used to construct various types of integrated circuits (ICs). CMOS technology is used in microprocessors, microcontrollers, memory devices, (e.g., random access memory (RAM)), and other digital logic circuits. Typically, a CMOS circuit uses complementary and symmetrical pairs of n-type channel metal-oxide-semiconductor (NMOS) and p-type channel metal-oxide-semiconductor (PMOS) transistors. Since only one of the NMOS or PMOS transistors are used at any given time, the CMOS circuit requires less power than a circuit using only one transistor type.

For example, FIG. 1A shows a simple conventional CMOS circuit 100 that includes two NOR gates 102 and 104. The NOR gate 102 includes PMOS transistors 106 and 108, and NMOS transistors 110 and 112. The NOR gate 104 includes PMOS transistors 114 and 116, and NMOS transistors 118 and 120. The CMOS circuit 100 further includes NMOS transistors 122 and 124, a negative power supply terminal (Vss) 126, a positive power supply terminal (Vdd) 128, inputs 130, 132 and 134, outputs 136 and 138, and a parasitic net (i.e., wire, connection) 140. Each of the transistors 106, 108, 110, 112, 114, 116, 118, 120, 122 and 124 includes a gate terminal A, a source terminal B and a drain terminal C.

FIG. 1B shows a symbolic circuit associated with the functionality of the conventional CMOS circuit 100 of FIG. 1A, whereby the NOR gates 102 and 104 share the input 132.

The output 136 of the NOR gate 102 is either a logic 1 or a logic 0 based on the inputs 130 and 132 in accordance with Table 1 below.

TABLE 1

| Input 130 of NOR gate 102 | Input 132 of NOR gate 102 | Output 136 of NOR gate 102 |
|---|---|---|
| 0 | 0 | 1 |
| 0 | 1 | 0 |
| 1 | 0 | 0 |
| 1 | 1 | 0 |

As shown in FIG. 1A, the PMOS transistors 106 and 108 of the NOR gate 102 are connected in series, (i.e., they form a PMOS stack 106/108), whereby the source terminal 106B is connected to Vdd 128, the drain terminal 106C is connected to the source terminal 108B, and the drain terminal 108C is connected to the output 136. The NMOS transistors 110 and 112 are connected in parallel, whereby the source terminals 110B and 112B are connected to Vss 126, and the drain terminals 110C and 112C are connected to the output 136. As indicated in Table 1 above, if either or both of the inputs 130 and 132 of the NOR gate 102 is a logic 1, either or both of the NMOS transistors 110 and 112 is turned on, causing the output 136 to be a logic 0. In order for the output 136 to be a logic 1, both of the inputs 130 and 132 must be a logic 0, which turns on both of the PMOS transistors 106 and 108 and allows Vdd 128 to pass through the stack 106/108, while at the same time turning of the NMOS transistors 110 and 112.

The output 138 of the NOR gate 104 is either a logic 1 or a logic 0 based on the inputs 132 and 134 in accordance with Table 2 below.

TABLE 2

| Input 132 of NOR gate 104 | Input 134 of NOR gate 104 | Output 138 of NOR gate 104 |
|---|---|---|
| 0 | 0 | 1 |
| 0 | 1 | 0 |
| 1 | 0 | 0 |
| 1 | 1 | 0 |

As shown in FIG. 1A, the PMOS transistors 114 and 116 of the NOR gate 104 are connected in series, (i.e., they form a PMOS stack 114/116), whereby the source terminal 114B is connected to Vdd 128, the drain terminal 114C is connected to the source terminal 116B, and the drain terminal 116C is connected to the output 138. The NMOS transistors 118 and 120 are connected in parallel, whereby the source terminals 118B and 120B are connected to Vss 126, and the drain terminals 118C and 120C are connected to the output 138. As indicated in Table 2 above, if either or both of the inputs 132 and 134 of the NOR gate 104 is a logic 1, either or both of the NMOS transistors 118 and 120 is turned on, causing the output 138 to be a logic 0. In order for the output 138 to be a logic 1, both of the inputs 132 and 134 must be a logic 0, which turns on both of the PMOS transistors 114 and 116 and allows Vdd 128 to pass through the stack 114/116, while at the same time turning of the NMOS transistors 118 and 120.

The inputs 130, 132 and 134 to the CMOS circuit 100 are typically provided on a monotonic (i.e., clocklike) basis, rather than on a static basis, whereby each input's logic value (1 or 0) undergoes a transition each cycle. The outputs 136 and 138 are typically used to drive a dynamic logic circuit, (e.g., an NMOS device, register file, and the like). If the NMOS transistors 122 and 124 were not in the CMOS circuit 100, a problem of glitching may occur due to the net 140 exhibiting a parasitic capacitance.

For example, the parasitic capacitance exhibited by the net 140 may be affected by the condition where the PMOS transistor 108 is turned on by a logic 0 at the input 130. Thus, a charge accumulating on the net 140 would be transferred through the PMOS transistor 108 to the output 136, which may cause glitching even though the output 136 should have a logic 0 value because the input 132 has a logic value of 1. The size of the charge that is transferred may be affected by the amount of charge stored on the net 140, as well as the amount of capacitance on the net 140 and on the output 136. However, the NMOS transistors 122 and 124 in the CMOS circuit 100 serve as a net pulldown circuit that solves this potential output glitching problem by discharging the net 140 when the input 132 is a logic 1.

Thus, a CMOS circuit is needed that can avoid the glitching problem described above with respect to the example conventional CMOS circuit of FIGS. 1A and 1B.

SUMMARY OF EMBODIMENTS

A complementary metal oxide semiconductor (CMOS) circuit is described. The CMOS circuit includes a plurality of CMOS gates, a plurality of logic inputs and a logic output. Each CMOS gate is connected to a negative power supply terminal (Vss) and a positive power supply terminal (Vdd). The CMOS circuit further includes parasitic nets connected to the CMOS gates, and net pulldown circuits for eliminating a charge accumulation on the parasitic nets while avoiding potential short circuit conditions.

In one example, the CMOS circuit includes two parasitic nets connected to each of the CMOS gates, and two net pulldown circuits for eliminating a charge that has accumulated on the parasitic nets when two of the logic inputs are set to a select logic value. The CMOS gates may be OR-AND-INVERT (OAI) gates or AND-OR-INVERT (AOI) gates.

Each net pulldown circuit eliminates a charge that has accumulated on a parasitic net. The net pulldown circuit may include a first transistor having a first drain terminal connected to the first parasitic net, a first source terminal, and a first gate terminal connected to a first one of the logic inputs. The net pulldown circuit may further include a second transistor having a second drain terminal connected to the first source terminal, a second gate terminal connected to a second one of the logic inputs, and a second drain terminal connected to the negative power supply terminal (Vss).

The first and second transistors may be n-type channel metal-oxide-semiconductor (NMOS) transistors. Each of the logic inputs may be connected to a gate terminal of one of the PMOS transistors and a gate terminal of one of the NMOS transistors.

In another embodiment, a computer-readable storage medium is configured to store a set of instructions used for manufacturing a semiconductor device. The semiconductor device may include a plurality of complementary metal oxide semiconductor (CMOS) gates. Each CMOS gate may be connected to a negative power supply terminal (Vss) and a positive power supply terminal (Vdd). Each CMOS gate may include a plurality of logic inputs and a logic output. The semiconductor device may further include a first parasitic net connected to each of the CMOS gates, and a first net pulldown circuit for eliminating a charge that has accumulated on the first parasitic net. The first net pulldown circuit may include a first transistor having a first drain terminal connected to the first parasitic net, a first source terminal, and a first gate terminal connected to a first one of the logic inputs. The first net pulldown circuit may further include a second transistor having a second drain terminal connected to the first source terminal, a second gate terminal connected to a second one of the logic inputs, and a second drain terminal connected to the negative power supply terminal (Vss). The instructions may be Verilog data instructions or hardware description language (HDL) instructions.

BRIEF DESCRIPTION OF THE DRAWINGS

A more detailed understanding may be had from the following description, given by way of example in conjunction with the accompanying drawings wherein:

FIGS. 3A and 3B, taken together, show an example of a complex CMOS circuit including a plurality of logic gates and an enhanced net pulldown circuit configured in accordance with the present invention.

DETAILED DESCRIPTION

The present invention provides a solution for complex CMOS circuits to avoid glitching. The CMOS circuit configured in accordance with the present invention is also faster and smaller than alternate implementations used to drive NMOS pulldowns in dynamic logic.

Figure 2A:
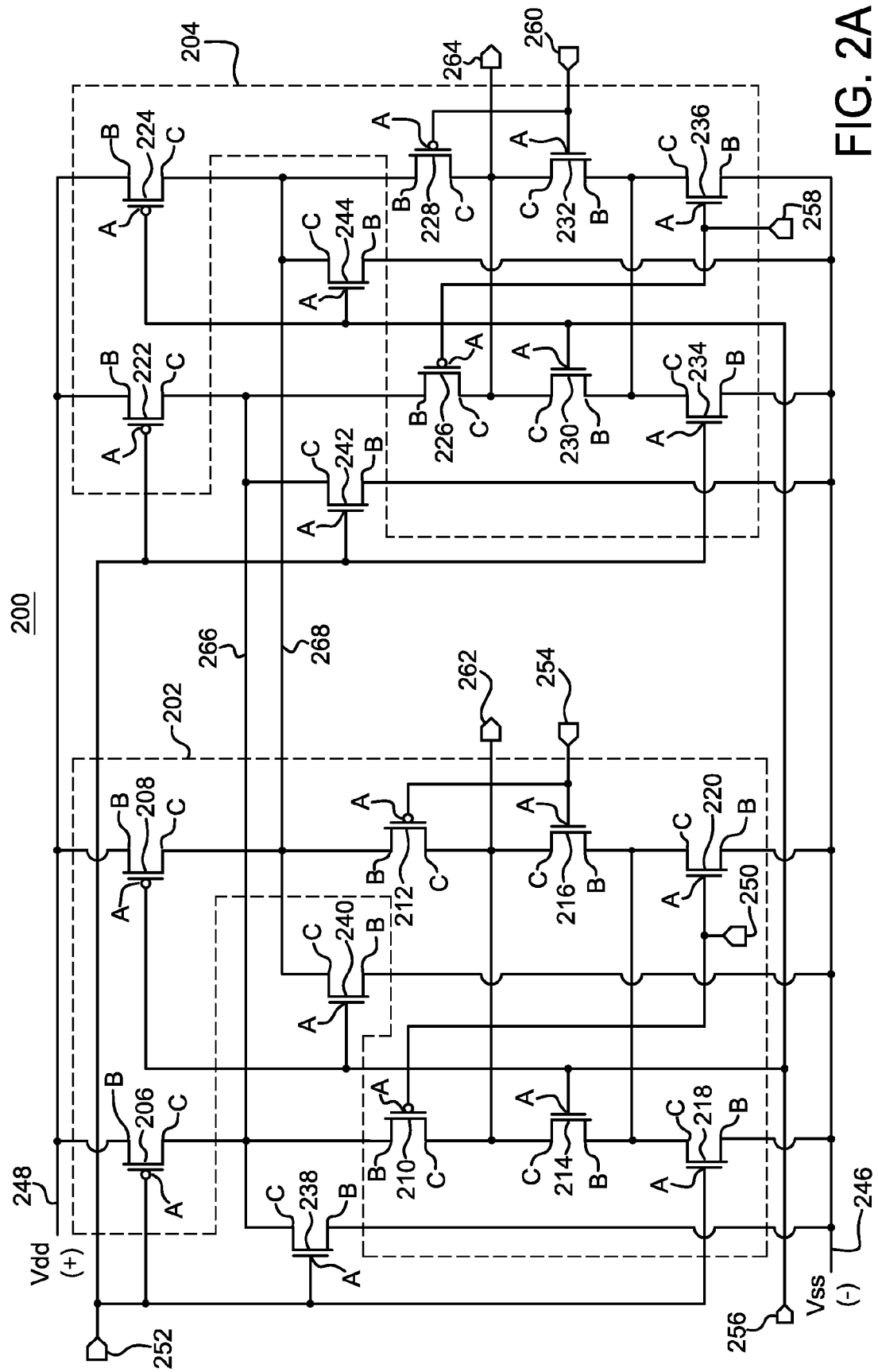
FIG. 2A shows an example of a complex CMOS circuit including a plurality of logic gates and a net pulldown circuit that is potentially subject to a short circuit.

FIG. 2A shows a complex CMOS circuit 200 that includes two OR-AND-INVERT (OAI) gates 202 and 204. The OAI gate 202 includes PMOS transistors 206, 208, 210 and 212, and NMOS transistors 214, 216, 218 and 220. The OAI gate 204 includes PMOS transistors 222, 224, 226 and 228, and NMOS transistors 230, 232, 234 and 236. The CMOS circuit 200 further includes NMOS transistors 238, 240, 242 and 244, a negative power supply terminal (Vss) 246, a positive power supply terminal (Vdd) 248, inputs 250, 252, 254, 256, 258 and 260, outputs 262 and 264, and parasitic nets (i.e., wires, connections) 266 and 268. Each of the transistors 206, 208, 210, 212, 214, 216, 218, 220, 222, 224, 226, 228, 230, 232, 234, 236, 238, 240, 242 and 244 includes a gate terminal A, a source terminal B and a drain terminal C.

Figure 2B:
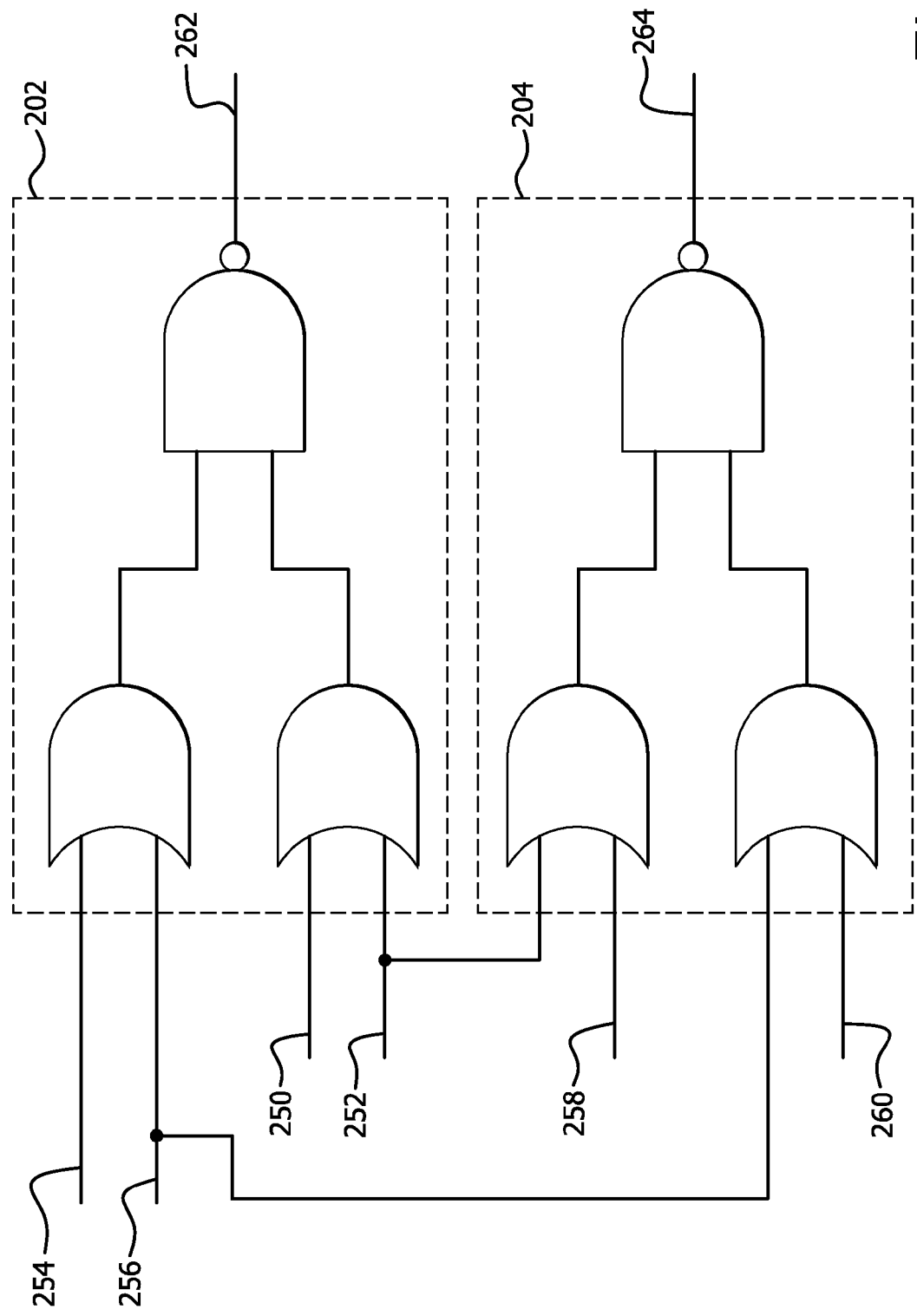
FIG. 2B shows a symbolic circuit associated with the functionality of the CMOS circuit of FIG. 2A.

FIG. 2B shows a symbolic circuit associated with the functionality of the CMOS circuit 200 of FIG. 2A, whereby the OAI gates 202 and 204 share the inputs 252 and 256.

Figure 1A:
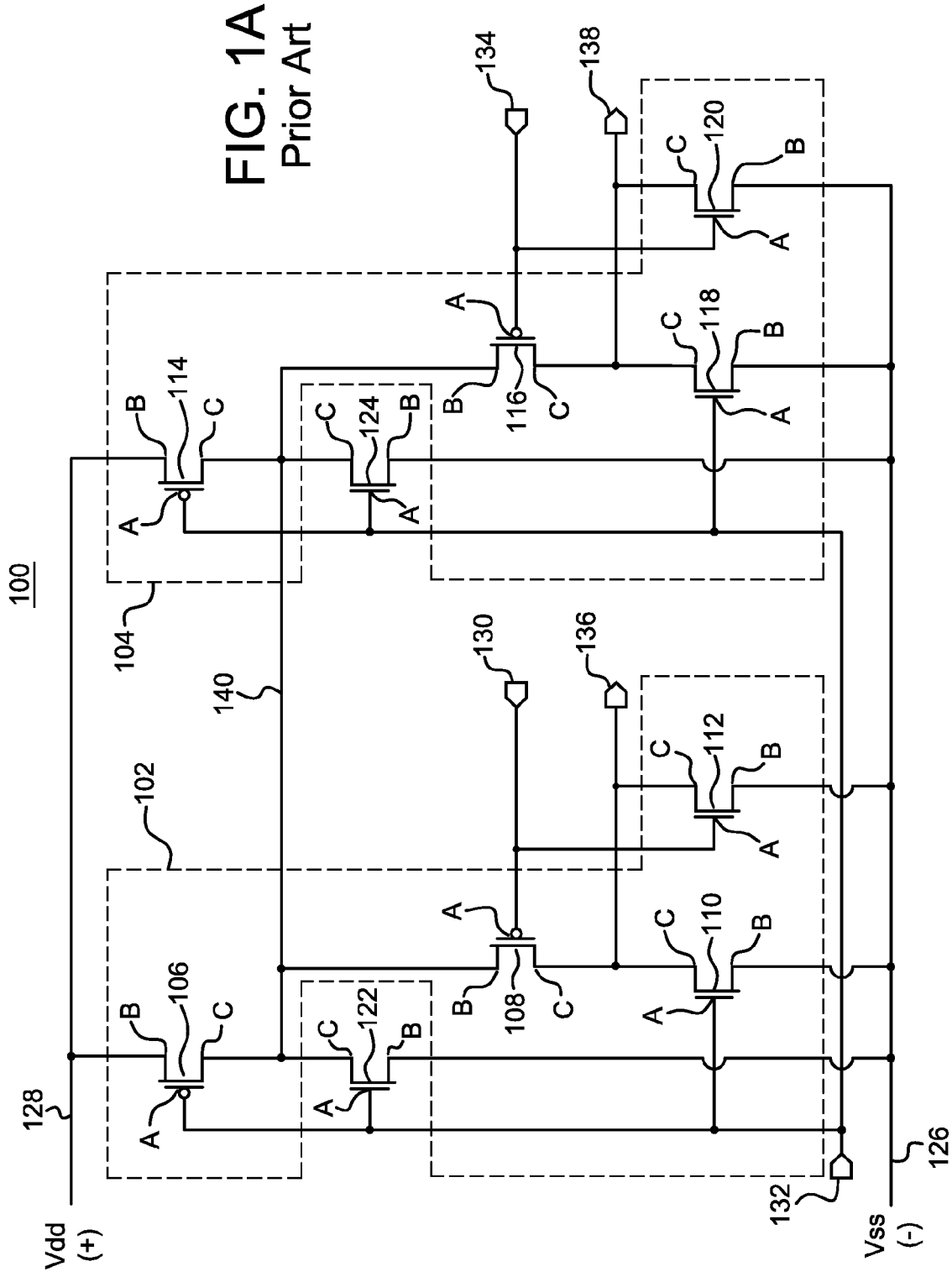
FIG. 1A shows an example of a simple conventional CMOS circuit including a plurality of logic gates and a net pulldown circuit.
Figure 1B:
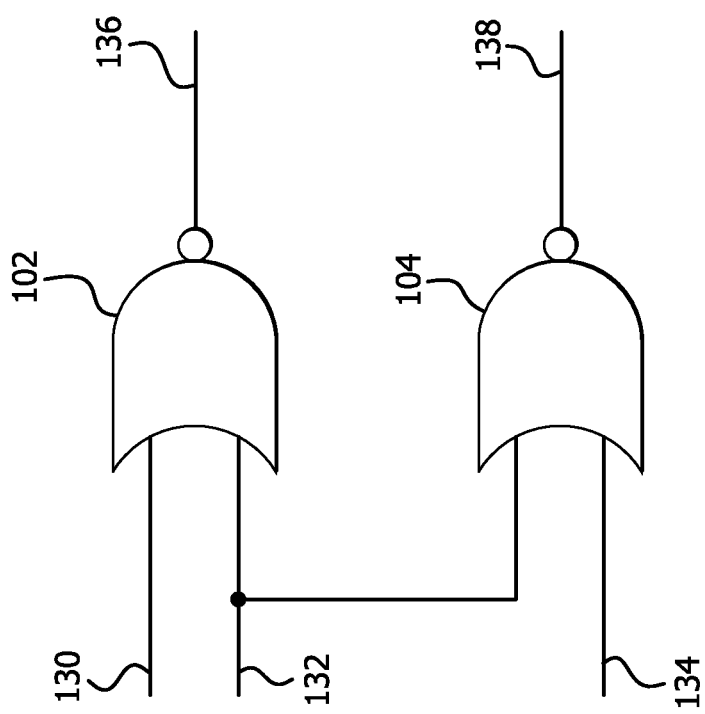
FIG. 1B shows a symbolic circuit associated with the functionality of the CMOS circuit of FIG. 1A.

Similar to the CMOS circuit 100 of FIG. 1A, the inputs 250, 252, 254, 256, 258 and 260 to the CMOS circuit 200 are typically provided on a monotonic (i.e., clocklike) basis, rather than on a static basis, whereby each input's logic value (1 or 0) undergoes a transition each cycle. The outputs 262 and 264 are typically used to drive a dynamic logic circuit, (e.g., an NMOS device, register file, and the like).

The CMOS circuit 200 of FIG. 2A incorporates the NMOS transistors 238, 240, 242 and 244 to serve as a net pulldown circuit that eliminates potential glitching problems that may occur due to the nets 266 and 268 exhibiting a parasitic capacitance. However, a short circuit potentially may occur between Vdd 248 and Vss 246. For example, if there is a logic 0 at inputs 250, 254 and 256, and a logic 1 at input 252, whereby the PMOS transistors 208, 210 and 212 are turned on, as well as the NMOS transistor 238, current would flow from Vdd 248 through PMOS transistors 208, 212 and 210, and the NMOS transistor 238 to Vss 246, thus causing a short circuit.

Figure 3A:
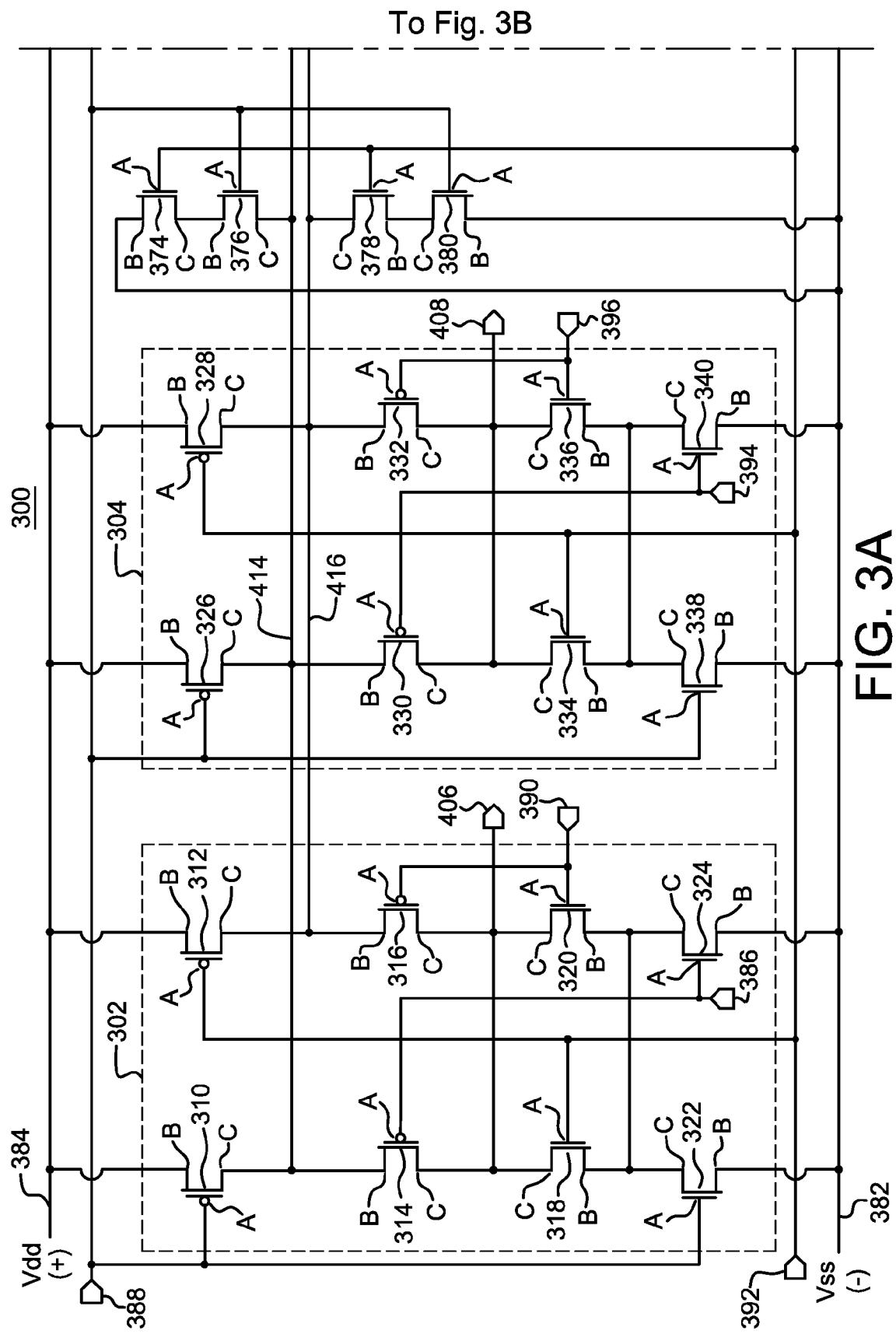

FIGS. 3A and 3B, taken together, show an example complex CMOS circuit 300 that includes four OR-AND-INVERT (OAI) gates 302, 304, 306 and 308 that is configured in accordance with the present invention. The CMOS circuit 300 is configured to avoid the short circuit scenario described above with respect to the CMOS circuit 200 of FIGS. 2A and 2B. The OAI gate 302 includes PMOS transistors 310, 312, 314 and 316, and NMOS transistors 318, 320, 322 and 324. The OAI gate 304 includes PMOS transistors 326, 328, 330 and 332, and NMOS transistors 334, 336, 338 and 340. The OAI gate 306 includes PMOS transistors 342, 344, 346 and 348, and NMOS transistors 350, 352, 354 and 356. The OAI gate 308 includes PMOS transistors 358, 360, 362 and 364, and NMOS transistors 366, 368, 370 and 372. The CMOS circuit 300 further includes NMOS transistors 374, 376, 378 and 380, a negative power supply terminal (Vss) 382, a positive power supply terminal (Vdd) 384, inputs 386, 388, 390, 392, 394, 396, 398, 400, 402 and 404, outputs 406, 408, 410 and 412, and parasitic nets (i.e., wires, connections) 414 and 416. Each of the transistors 310, 312, 314, 316, 318, 320, 322, 324, 326, 328, 330, 332, 334, 336, 338, 340, 342, 344, 346, 348, 350, 352, 354, 356, 358, 360, 362, 364, 366, 368, 370, 372, 374, 376, 378 and 380 includes a gate terminal A, a source terminal B and a drain terminal C.

Figure 3C:
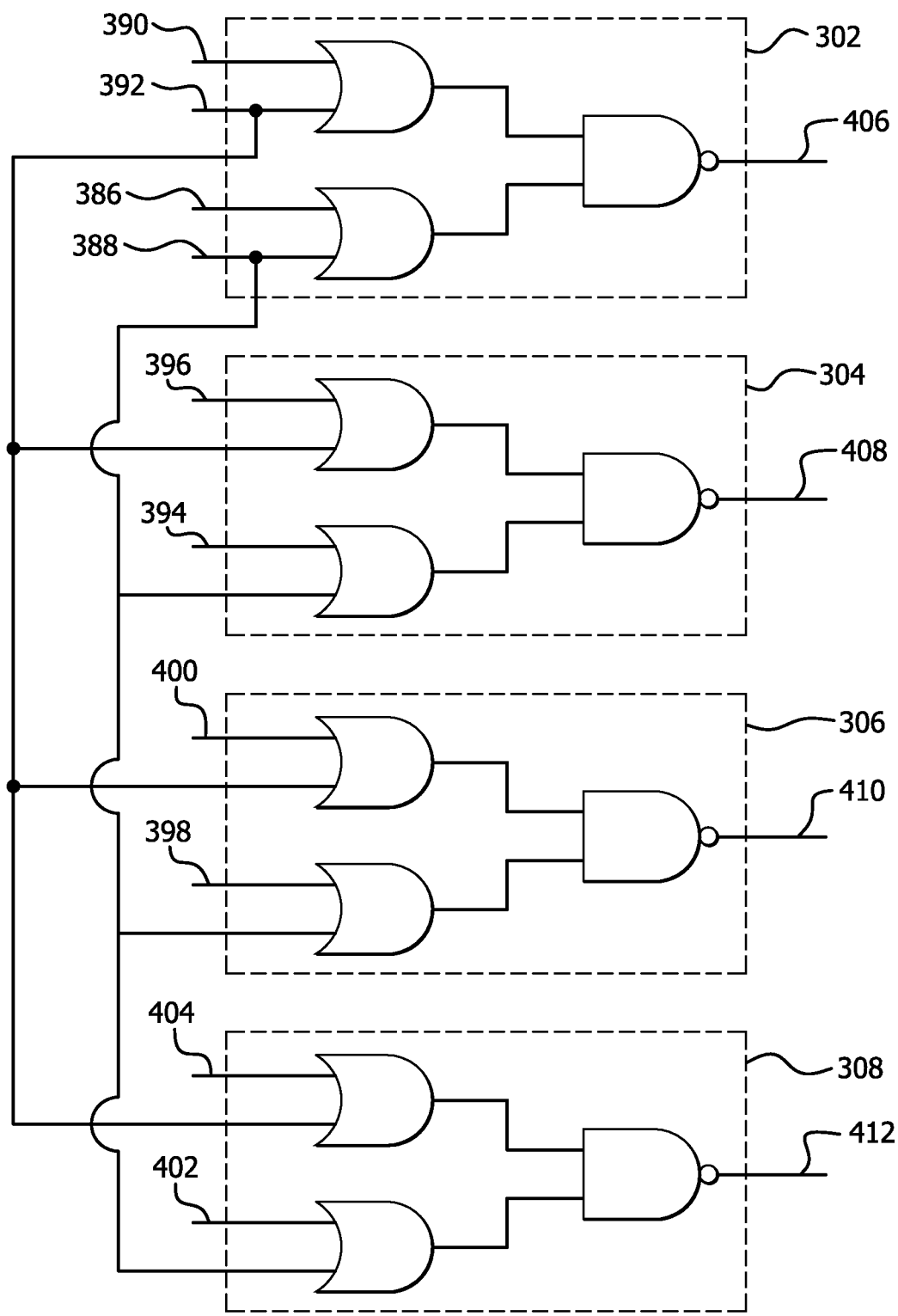
FIG. 3C shows a symbolic circuit associated with the functionality of the CMOS circuit of FIGS. 3A and 3B.

FIG. 3C shows a symbolic circuit associated with the functionality of the CMOS circuit 300 of FIGS. 3A and 3B, whereby the OAI gates 302, 304, 306 and 308 share the inputs 388 and 392.

The inputs 386, 388, 390, 392, 394, 396, 398, 400, 402 and 404 to the CMOS circuit 300 of FIGS. 3A and 3B are typically provided on a monotonic (i.e., clocklike) basis, rather than on a static basis, whereby each input's logic value (1 or 0) undergoes a transition each cycle. The outputs 406, 408, 410 and 412 are typically used to drive a dynamic logic circuit, (e.g., an NMOS device, register file, and the like). Although OAI gates are used in the CMOS circuit 300 of FIGS. 3A and 3B, the present invention may also be applicable to a CMOS circuit including AND-OR-INVERT (AOI) gates. The two logic inputs 388 and 392 turn on and off the PMOS transistors, each of which is connected between the positive power source (Vdd) and either of the parasitic nets 414 or 416. These logic inputs 388 and 392 drive NMOS pulldowns (374, 376, 378 and 380) that are used to pre-discharge the internal PMOS stack nodes in the CMOS circuit 300. By pre-discharging the internal PMOS stack nodes, any potential glitching at the outputs 406, 408, 410 and 412 is eliminated.

Since the CMOS circuit 300 includes relatively complex OAI gates, there is a potential for glitching problems to occur because the capacitance on the internal stack nets 414 and 416 is larger, as compared to the net 140 in the conventional CMOS circuit 100 of FIG. 1A. By incorporating a first net pulldown circuit including NMOS transistors 374 and 376 for net 414, and a second net pulldown circuit including NMOS transistors 378 and 380 for net 416, glitching problems are avoided in the CMOS circuit 300 while avoiding potential short circuits.

Additionally, the two logic inputs 388 and 392 are common to four instances of an OAI gate (302, 304, 306 and 308) and short together the internal stack nodes on these four gates. This has two benefits. First, the size of the PMOS transistors 310, 312, 326, 328, 342, 344, 358 and 360 may be reduced to save silicon area. Second, a greater total drive strength may be achieved by using smaller devices than would be used if they were not shorted together. Higher drive strength indicates that the gate will switch faster and the circuit may achieve a greater total speed. The drive strength is increased because four PMOS transistors, (e.g., 310, 326, 342 and 358 are connected in parallel via net 414, and 312, 328, 344 and 360 are connected in parallel via net 416), are effectively connected in parallel with the same input (388 or 392).

Each PMOS stack in a typical OAT gate only has single PMOS transistors, without a net (i.e., internal node) being tied to other gates. For example, the OAT gate 302 by itself would not be connected to another gate. Assuming that the transistor 310 has a width, W, drive strength is directly proportional to the width W. So, the transistor 310 may be considered as having a drive strength equal to W. The only way to increase the drive strength is to increase W. Taking into consideration all four gates 302, 304, 306 and 308 that have PMOS transistors 310, 326, 342, 358 all connected in parallel, and assuming that all four of these transistors have a width W, the total width is 4W. Thus, the drive strength is increased from W to 4W just by connecting the internal stack nodes. Alternatively, a smaller silicon area may be obtained by sizing each PMOS transistor as W/2. These PMOS transistors may then take up half the silicon area, and the total drive strength of the four PMOS transistors may be equivalent to 2W.

The present invention is applicable to complex gates to successfully avoid the charge sharing problem, in order to provide faster and more compact CMOS circuit implementations.

Although features and elements are described above in particular combinations, each feature or element can be used alone without the other features and elements or in various combinations with or without other features and elements. The apparatus described herein may be manufactured using a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine, or combinations thereof.

What is claimed is:

1. A complementary metal oxide semiconductor (CMOS) circuit comprising:
   a plurality of CMOS gates, each CMOS gate connected to a negative power supply terminal (Vss) and a positive power supply terminal (Vdd), each CMOS gate including a plurality of logic inputs and a logic output;
   a first parasitic net connected to each of the CMOS gates; and
   a first net pulldown circuit comprising:
      a first transistor having a first drain terminal connected to the first parasitic net, a first source terminal, and a first gate terminal connected to a first one of the logic inputs; and
      a second transistor having a second drain terminal connected to the first source terminal, a second gate terminal connected to a second one of the logic inputs, and a second source terminal connected to the negative power supply terminal (Vss);
   a second parasitic net connected to each of the CMOS gates; and
   a second net pulldown circuit comprising:
      a third transistor having a third drain terminal connected to the second parasitic net, a third source terminal, and a third gate terminal connected to the second logic input; and
      a fourth transistor having a fourth drain terminal connected to the third source terminal, a fourth gate terminal connected to the first logic input, and a fourth source terminal connected to the negative power supply terminal (Vss).

2. The CMOS circuit of claim 1 wherein the first and second transistors are n-type channel metal-oxide-semiconductor (NMOS) transistors.

3. The CMOS circuit of claim 1 wherein the CMOS gates are OR-AND-INVERT (OAI) gates.

4. The CMOS circuit of claim 1 wherein the CMOS gates are AND-OR-INVERT (AOI) gates.

5. The CMOS circuit of claim 1 further comprising:
a plurality of p-type channel metal-oxide-semiconductor (PMOS) transistors.

6. The CMOS circuit of claim 5 further comprising:
a plurality of n-type channel metal-oxide-semiconductor (NMOS) transistors.

7. The CMOS circuit of claim 6 wherein each of the logic inputs is connected to a gate terminal of one of the PMOS transistors and a gate terminal of one of the NMOS transistors.

8. The CMOS circuit of claim 1 wherein the first net pulldown circuit eliminates a charge that has accumulated on the first parasitic net when the first and second logic inputs are set to a select logic value.

9. The CMOS circuit of claim 1 wherein each of the first and second parasitic nets has a parasitic capacitance.

10. A transistor circuit comprising:
a plurality of logic gates, each logic gate connected to a negative power supply terminal (Vss) and a positive power supply terminal (Vdd), each logic gate including a plurality of logic inputs and a logic output;
a first parasitic net connected to each of the logic gates; and
a first net pulldown circuit comprising:
a first transistor having a first drain terminal connected to the first parasitic net, a first source terminal, and a first gate terminal connected to a first one of the logic inputs; and
a second transistor having a second drain terminal connected to the first source terminal, a second gate terminal connected to a second one of the logic inputs, and a second source terminal connected to the negative power supply terminal (Vss);
a second parasitic net connected to each of the CMOS gates; and
a second net pulldown circuit comprising:
a third transistor having a third drain terminal connected to the second parasitic net, a third source terminal, and a third gate terminal connected to the second logic input; and
a fourth transistor having a fourth drain terminal connected to the third source terminal, a fourth gate terminal connected to the first logic input, and a fourth source terminal connected to the negative power supply terminal (Vss).

11. The transistor circuit of claim 10 wherein the first and second transistors are n-type channel metal-oxide-semiconductor (NMOS) transistors.

12. The transistor circuit of claim 10 wherein the logic gates are OR-AND-INVERT (OAI) gates.

13. The transistor circuit of claim 10 wherein the logic gates are AND-OR-INVERT (AOI) gates.

14. The transistor circuit of claim 10 wherein the first net pulldown circuit eliminates a charge that has accumulated on the first parasitic net when the first and second logic inputs are set to a select logic value.

15. The transistor circuit of claim 10 wherein each of the first and second parasitic nets has a parasitic capacitance.

16. A non-transitory computer-readable storage medium configured to store a set of instructions used for manufacturing a semiconductor device, wherein the semiconductor device comprises:
a plurality of complementary metal oxide semiconductor (CMOS) gates, each CMOS gate connected to a negative power supply terminal (Vss) and a positive power supply terminal (Vdd), each CMOS gate including a plurality of logic inputs and a logic output;
a first parasitic net connected to each of the CMOS gates; and
a first net pulldown circuit comprising:
a first transistor having a first drain terminal connected to the first parasitic net, a first source terminal, and a first gate terminal connected to a first one of the logic inputs; and
a second transistor having a second drain terminal connected to the first source terminal, a second gate terminal connected to a second one of the logic inputs, and a second source terminal connected to the negative power supply terminal (Vss);
a second parasitic net connected to each of the CMOS gates; and
a second net pulldown circuit comprising:
a third transistor having a third drain terminal connected to the second parasitic net, a third source terminal, and a third gate terminal connected to the second logic input; and
a fourth transistor having a fourth drain terminal connected to the third source terminal, a fourth gate terminal connected to the first logic input, and a fourth source terminal connected to the negative power supply terminal (Vss).

17. The computer-readable storage medium of claim 16 wherein the instructions are Verilog data instructions.

18. The computer-readable storage medium of claim 16 wherein the instructions are hardware description language (HDL) instructions.

* * * * *